(12) United States Patent
Liu et al.

(10) Patent No.: US 10,861,916 B2
(45) Date of Patent: Dec. 8, 2020

(54) DISPLAY SUBSTRATE, MANUFACTURING METHOD THEREOF AND DISPLAY PANEL

(71) Applicant: BOE TECHNOLOGY GROUP CO., LTD., Beijing (CN)

(72) Inventors: Wei Liu, Beijing (CN); Ying Han, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/707,331

(22) Filed: Dec. 9, 2019

(65) Prior Publication Data
US 2020/0273923 A1 Aug. 27, 2020

(30) Foreign Application Priority Data
Feb. 21, 2019 (CN) .......................... 2019 1 0129570

(51) Int. Cl.
*H01L 27/32* (2006.01)
*H01L 51/52* (2006.01)
(Continued)

(52) U.S. Cl.
CPC ............ *H01L 27/326* (2013.01); *H01L 33/36* (2013.01); *H01L 33/42* (2013.01);
(Continued)

(58) Field of Classification Search
CPC ....... H01L 27/326; H01L 33/36; H01L 33/42; H01L 51/5203; H01L 51/5212; H01L 51/5228
See application file for complete search history.

(56) References Cited

U.S. PATENT DOCUMENTS

2007/0029929 A1* 2/2007 Nakamura .......... H01L 27/3276 313/506
2010/0060147 A1* 3/2010 Eom ................... H01L 51/5234 313/504
(Continued)

FOREIGN PATENT DOCUMENTS

| CN | 107394060 A | 11/2017 |
| CN | 107565048 A | 1/2018 |
| CN | 108269831 A | 7/2018 |

OTHER PUBLICATIONS

First office action dated Apr. 29, 2020 for application No. 201910129570.3 with English Translation attached.

*Primary Examiner* — Allan R Wilson
(74) *Attorney, Agent, or Firm* — Nath, Goldberg & Meyer; Joshua B. Goldberg

(57) ABSTRACT

The present application provides a display substrate, a method of manufacturing the same and a display panel. The display substrate includes pixel units each including a light emitting region and a transparent display region. A light emitting element including a first electrode, a light emitting functional layer and a second electrode is provided in the light emitting region, and second electrodes of light emitting elements forms a second electrode layer having an integral structure. The display substrate further includes an auxiliary electrode in the light emitting region and an auxiliary connection member made of a transparent conductive material. A portion of the auxiliary connection member is in the light emitting region and electrically coupled with the auxiliary electrode and another portion thereof is in the transparent display region and electrically coupled with the second electrode layer.

12 Claims, 3 Drawing Sheets

(51) Int. Cl.
  *H01L 33/42*   (2010.01)
  *H01L 33/36*   (2010.01)
(52) U.S. Cl.
  CPC ...... *H01L 51/5203* (2013.01); *H01L 51/5212* (2013.01); *H01L 51/5228* (2013.01); *H01L 51/5237* (2013.01); *H01L 2227/323* (2013.01); *H01L 2251/305* (2013.01)

(56) References Cited

U.S. PATENT DOCUMENTS

| | | |
|---|---|---|
| 2014/0239262 A1 | 8/2014 | Kim et al. |
| 2018/0006098 A1 | 1/2018 | Hong et al. |
| 2018/0151828 A1* | 5/2018 | Im ...................... H01L 51/5228 |
| 2018/0190935 A1 | 7/2018 | Kim et al. |
| 2019/0067390 A1 | 2/2019 | Gao |
| 2019/0074338 A1 | 3/2019 | Gu |
| 2019/0115561 A1* | 4/2019 | Tang .................. H01L 51/5228 |
| 2019/0273125 A1* | 9/2019 | Takechi .............. H01L 51/5234 |
| 2020/0013986 A1* | 1/2020 | Li ...................... H01L 51/5234 |

\* cited by examiner

DISPLAY SUBSTRATE, MANUFACTURING METHOD THEREOF AND DISPLAY PANEL

CROSS REFERENCE TO RELATED APPLICATION

This application claims priority to Chinese patent application No. 201910129570.3, filed on Feb. 21, 2019, the entire contents of which are incorporated herein by reference.

TECHNICAL FIELD

The present disclosure relates to the field of display devices, and in particular, to a display substrate, a method of manufacturing the display substrate, and a display panel including the display substrate.

BACKGROUND

With the development of display technology, transparent display devices have been developed. One type of transparent display devices is organic light emitting diode transparent display devices. Currently, in the display panel of the organic light emitting diode display device, the area of the transparent region can reach 40% of the total area of the display surface of the display panel.

In general, when the organic light emitting diodes of the display panel are top emission type organic light emitting diodes, cathodes of a plurality of organic light emitting diodes are electrically coupled to each other and formed as an entire plate electrode. As the size of the display panel increases, the IR drop of the plate electrode during display may cause the brightness of the display panel to be uneven.

SUMMARY

In an aspect, the present disclosure provides a display substrate. In some embodiments, the display substrate includes a plurality of pixel units, each of the plurality of pixel units including a light emitting region and a transparent display region, a light emitting element being provided in the light emitting region and including a first electrode, a light emitting functional layer and a second electrode, the second electrode being on a light exiting side of the light emitting element, and second electrodes of a plurality of light emitting elements forming a second electrode layer having an integral structure. The display substrate further includes an auxiliary electrode in the light emitting region, the auxiliary electrode being on a side of the light emitting element opposite to the light exiting side and made of a metal material, and the display substrate further includes an auxiliary connection member made of a transparent conductive material, a portion of the auxiliary connection member being in the light emitting region, another portion of the auxiliary connection member being in the transparent display region, the auxiliary electrode is electrically coupled with the portion of the auxiliary connection member in the light emitting region, and the second electrode layer is electrically coupled with the other portion of the auxiliary connection member in the transparent display region.

In some embodiments, the auxiliary connection member includes a conductorized transparent semiconductor material.

In some embodiments, a thin film transistor with a top gate type is in the light emitting region, the thin film transistor being on the side of the light emitting element opposite to the light exiting side and including a source-drain electrode layer and a gate electrode layer. The auxiliary electrode and the source-drain electrode layer are in a same layer.

In some embodiments, the auxiliary connection member and an active layer of the thin film transistor are in a same layer, the active layer includes a first semiconductor material, and the auxiliary connection member includes a conductorized first semiconductor material.

In some embodiments, the first semiconductor material includes indium gallium zinc oxide.

In some embodiments, the display substrate further includes: an interlayer insulating layer extending throughout the transparent display region and the light emitting region and covering the gate electrode layer to insulate the source-drain electrode layer from the gate electrode layer; and a passivation layer extending throughout the transparent display region and the light emitting region and covering the source-drain electrode layer. The second electrode layer is electrically coupled with the auxiliary connection member through a first via hole, the first via hole being in the transparent display region and penetrating through the passivation layer and the interlayer insulating layer.

In some embodiments, the display substrate further includes: a base substrate; a light shielding layer on the base substrate; and a buffer layer covering the light shielding layer and a portion of the base substrate on which the light shielding layer is not provided. The thin film transistor is on the buffer layer, and an orthographic projection of an active layer of the thin film transistor on the base substrate is within an orthographic projection of the light shielding layer on the base substrate.

In some embodiments, the source-drain electrode layer of the thin film transistor includes a source electrode and a drain electrode, and the drain electrode is electrically coupled with the light shielding layer through a second via hole, the second via hole penetrating through the interlayer insulating layer and the buffer layer.

In some embodiments, the first electrode is an anode and the second electrode is a cathode.

In another aspect, the present disclosure further provides a display panel including any of the display substrates described herein.

In another aspect, the present disclosure further provides a method of manufacturing a display substrate, including steps of: providing a base substrate, the base substrate being divided into a plurality of pixel units, each of the plurality of pixel units including a light emitting region and a transparent display region; forming an auxiliary electrode and forming an auxiliary connection member, the auxiliary connection member being formed of a transparent conductive material, a portion of the auxiliary connection member being formed in the light emitting region, another portion of the auxiliary connection member being formed in the transparent display region, the auxiliary electrode being formed in the light emitting region, and the auxiliary electrode being formed to be electrically coupled to the portion of the auxiliary connection member in the light emitting region; and forming a light emitting element in the light emitting region, the light emitting element including a first electrode, a light emitting functional layer, and a second electrode, second electrodes of a plurality of light emitting elements being formed as a second electrode layer having an integral structure, and the second electrode layer being formed to be electrically coupled to the other portion of the auxiliary connection member in the transparent display region.

In some embodiments, the auxiliary connection member is formed by performing a conductorization process on a transparent semiconductor material to form a conductrized transparent semiconductor material.

In some embodiments, the method further includes a step of forming a thin film transistor in the light emitting region before the step of forming a light emitting element in the light emitting region. The step of forming a thin film transistor in the light emitting region includes steps of: forming a pattern including an active layer; forming a gate insulating layer; forming a pattern including a gate electrode layer; forming an interlayer insulating layer; forming a pattern including a source-drain electrode layer; and forming a passivation layer. The step of forming an auxiliary electrode and one of the step of forming a pattern including a gate electrode layer and the step of forming a pattern including a source-drain electrode layer are performed simultaneously.

In some embodiments, the step of forming an auxiliary connection member includes steps of: forming an initial auxiliary connection member while the step of forming a pattern including an active layer is performed, a material of the active layer being the same as a material of the initial auxiliary connection member; and conductorizing the initial auxiliary connection member to obtain the auxiliary connection member.

In some embodiments, the material of the active layer includes indium gallium zinc oxide.

In some embodiments, the step of conductorizing the initial auxiliary connection member to obtain the auxiliary connection member is performed after the step of forming a pattern including a gate electrode layer.

In some embodiments, the step of forming an auxiliary electrode and the step of forming a pattern including a source-drain electrode layer are performed simultaneously, and the passivation layer and the interlayer insulating layer are formed to extend throughout the light emitting region and the transparent display region. Before the step of forming a pattern including a source-drain electrode layer, the method further includes a step of: forming a via hole penetrating through the passivation layer and the interlayer insulating layer. The second electrode layer is formed to be electrically coupled to the auxiliary connection member through the via hole.

In some embodiments, after the step of providing a base substrate and before the step of forming the thin film transistor, the method further includes steps of forming a layer of a light shielding pattern on the base substrate; and forming a buffer layer covering the layer of the light shielding pattern and a portion of the base substrate on which the layer of the light shielding pattern is not provided. An orthographic projection of the active layer of the thin film transistor on the base substrate is within an orthographic projection of the layer of light shielding pattern on the base substrate.

In some embodiments, the first electrode is an anode and the second electrode is a cathode.

BRIEF DESCRIPTION OF THE DRAWINGS

The accompanying drawings, which are included to provide a further understanding of the present disclosure and constitute a part of this specification, serve to explain the present disclosure together with the detailed description, but not limit the present disclosure, in which.

DETAILED DESCRIPTION

Hereinafter, embodiments of the present disclosure will be described in detail in conjunction with the accompanying drawings. It should be understood that the embodiments described herein are intended for purposes of illustration only and are not intended to limit the present disclosure.

In order to solve the problem that the brightness of the display panel is uneven due to the IR drop of the plate electrode during display, an auxiliary cathode line is usually arranged in the display panel, and an auxiliary electrode is electrically coupled with the cathode through a via hole to form a parallel structure, so that the IR drop in the signal transmission process is reduced.

Figure 1:
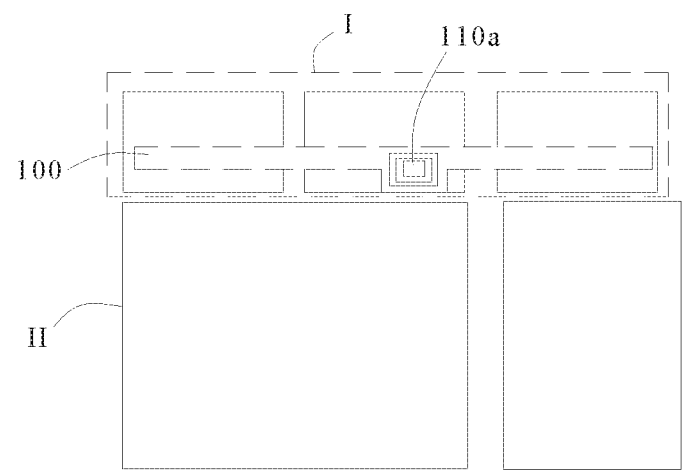
FIG. 1 is a schematic diagram of a pixel unit in a display panel.
Figure 2:
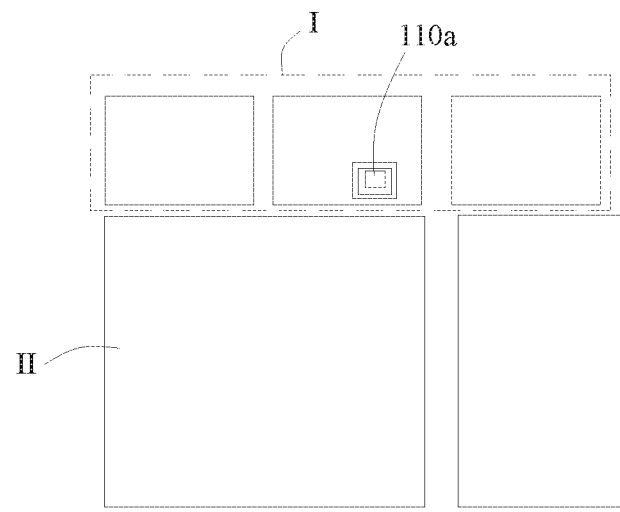
FIG. 2 is a schematic diagram of the pixel unit of FIG. 1 when emitting light.

FIG. 1 is a schematic diagram of a pixel unit in a display panel. As shown in FIG. 1, the pixel unit of the display panel includes a light emitting region I and a transparent display region II. The light emitting region is provided therein with a light emitting element, an auxiliary electrode 100 is disposed in the light emitting region and below the light emitting element, the auxiliary electrode 100 is electrically coupled to a plate electrode through a via hole 110a, and the auxiliary electrode 100, which is opaque, is at the bottom of the via hole 110a. When the display panel emits light, as shown in FIG. 2, since the via hole 110a is located in the light emitting region and penetrates through the light emitting element, the portion occupied by the via hole 110a not only fails to emit light, but also exposes the auxiliary electrode 100, thereby affecting normal light emission of the display panel.

Accordingly, the present disclosure provides, inter alia, a display substrate, a method of manufacturing the display substrate, and a display panel including the display substrate that substantially obviate one or more of the problems due to limitations and disadvantages of the related art.

Figure 3:
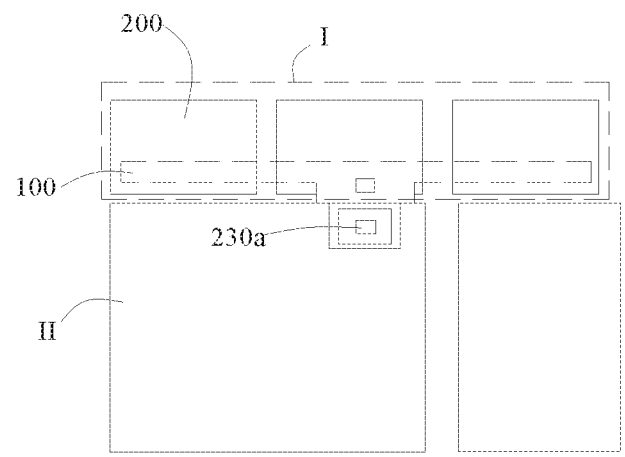
FIG. 3 is a schematic diagram of a pixel unit in a display substrate according to some embodiments of the present disclosure.
Figure 4:
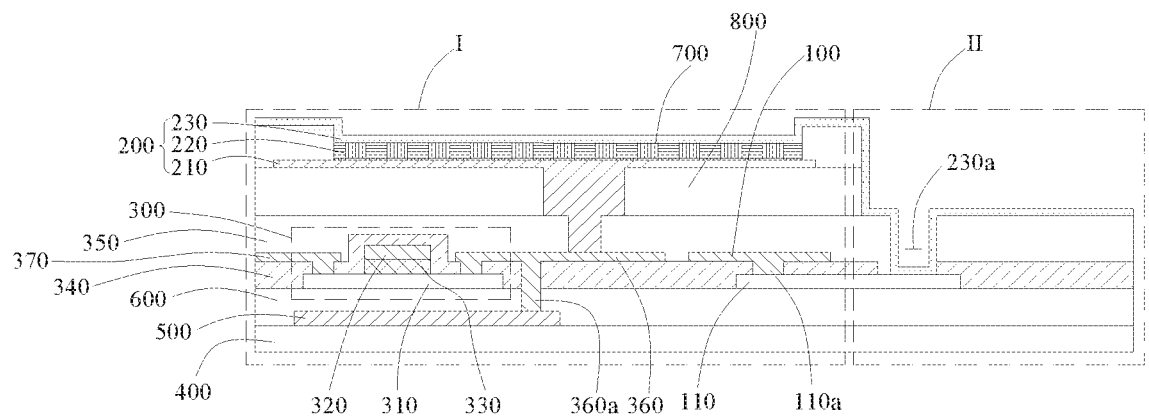
FIG. 4 is a partial cross-sectional view of the display substrate of FIG. 3.

As an aspect of the present disclosure, there is provided a display substrate including a display region divided into a plurality of pixel units. FIG. 3 is a schematic diagram of a pixel unit in a display substrate according to some embodiments of the present disclosure. As shown in FIG. 3, the pixel unit includes a light emitting region and a transparent display region II. Light emitting elements 200 are disposed in the light emitting region I. As shown in FIG. 4, the light emitting element 200 includes a first electrode 210, a light emitting functional layer 220, and a second electrode 230. The display substrate further includes a base substrate 400, the second electrode 230 is disposed on a side of the light emitting element 200 (e.g., a light exiting side of the light emitting elements 200) away from the base substrate 400, and the second electrodes 230 of a plurality of light emitting elements 200 are formed as a second electrode layer having an integral structure.

The display substrate further includes an auxiliary electrode 100 in the light emitting region. The display substrate further includes a plurality of auxiliary connection members 110 made of a transparent conductive material. A portion of the auxiliary connection member 110 is located in the light emitting region I, and another portion of the auxiliary connection member 110 is located in the transparent display region II. The auxiliary electrode 100 is electrically coupled to the portion of the auxiliary connection member 110 located in the light emitting region, and the second electrode layer is electrically coupled to the portion of the auxiliary connection member 110 located in the transparent display region II.

Figure 5:
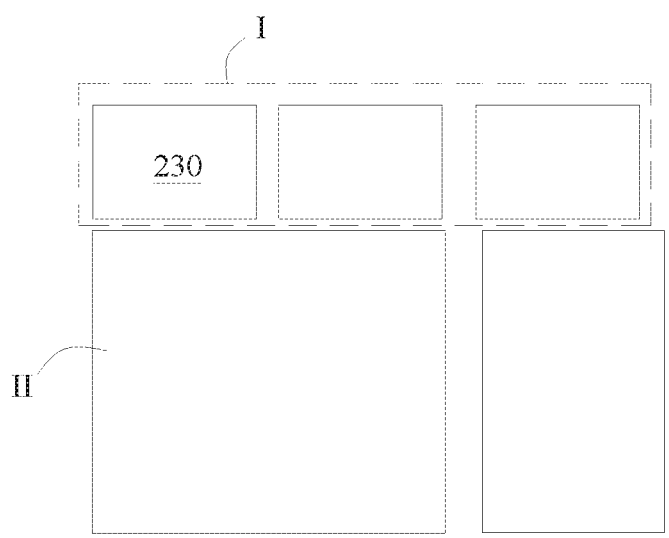
FIG. 5 is a schematic diagram of a pixel unit in a display panel when emitting light according to some embodiments of the present disclosure.

In the present disclosure, the auxiliary electrode 100 is made of a metal material having a small resistivity, and the auxiliary electrode 100 is disposed on a side of the light emitting element 200 (e.g., a side of the light emitting element facing away from the light exiting side) close to the base substrate 400. Therefore, the provision of the auxiliary electrode 100 does not affect the light emission of the light emitting element 200. The auxiliary connection member 110 is made of a transparent conductive material, and thus, does not affect the light transmittance of the transparent display region II even if it is disposed within the transparent display region II. The second electrode layer is also made of a transparent conductive material, and is electrically coupled to the transparent auxiliary connection member in the transparent display region, instead of being electrically coupled to the auxiliary electrode at the light emitting region as shown in FIG. 1. Thus, the integrity of the light emitting element is not damaged. When the light emitting element emits light, there is no shielding at the light emitting region due to electrical connection with the auxiliary electrode, as shown in FIG. 5. Moreover, the materials in the transparent display region II are transparent materials, the portion of the second electrode layer in the transparent display region II is electrically coupled with the auxiliary connection member in the transparent display region II and there is no opaque region, so that the light transmittance of the transparent display region II is unaffected.

The auxiliary electrode 100 may be made of a metal material, so that a parallel structure having a relatively low resistance may be formed with the second electrode layer and the auxiliary connection member 110. When the display panel including the present display substrate performs display, the parallel structure formed by the second electrode layer and the auxiliary electrode transmits an electric signal with lower IR drop, so that the brightness of the display panel is uniform, and a better display effect is obtained.

The auxiliary connection member 110 extends from the transparent display region II into the light emitting region I and is electrically coupled to the auxiliary electrode 100 in the light emitting region I, and does not affect the light transmittance of the transparent display region II.

In the present disclosure, a material of the auxiliary connection member 110 is not particularly limited. For example, the auxiliary connection member 110 may be made of a transparent electrode material. Alternatively, it may be made of a transparent conductive material obtained by conductorizing a transparent semiconductor material e.g., conductorized transparent semiconductor material). The semiconductor material is usually a transparent material, and can be made into a conductor by a conductorization process, such as plasma doping. The conductorized semiconductor material is still a transparent material, so that the light transmittance of the transparent display region II is not affected, and the conductorized semiconductor material functions as a conductive wire. For example, the semiconductor material layer may be made into a conductor by a conductorization process, in which a semiconductor material layer, for example, is surface-treated by helium (He) or the like to make the semiconductor material layer into a conductor, so that the conductorized semiconductor material layer (e.g., a conductive oxide layer) has a function of a conductor to transmit an electric signal therein.

In order to drive the light emitting element 200 to emit light, the display substrate includes a plurality of thin film transistors 300 disposed in the light emitting region I and on a side of the light emitting element 200 (e.g., a side of the light emitting element 200 facing away from the light exiting side thereof) close to the base substrate 400. In an example, the auxiliary connection member 110 may be formed by conductorizing the same semiconductor material as that of an active layer 310 of the thin film transistor 300.

The thin film transistor 300 includes a source-drain electrode layer and a gate electrode layer 320. In the structure shown in FIG. 4, the thin film transistor 300 has a top gate structure, and the auxiliary electrode 100 and the source-drain electrode layer are disposed in a same layer. Thus, the source-drain electrode layer and the auxiliary electrode 100 may be formed simultaneously. However, the present disclosure is not limited thereto, and the auxiliary electrode 100 and the gate electrode layer 320 may be disposed in a same layer, and accordingly, the gate electrode layer 320 and the auxiliary electrode 100 may be formed simultaneously. As used herein, the term "same layer" refers to the relationship between the layers simultaneously formed in the same step. In one example, the auxiliary electrode 100 and the source-drain electrode layer or the gate electrode layer 320 are in a same layer when they are formed as a result of one or more steps of a same patterning process performed in a same layer of material. In another example, the auxiliary electrode 100 and the source-drain electrode layer or the gate electrode layer 320 can be formed in a same layer by simultaneously performing the step of forming the auxiliary electrode 100 and the step of forming the source-drain electrode layer or the step of forming the gate electrode layer 320. The term "same layer" does not always mean that the thickness of the layer or the height of the layer in a cross-sectional view is the same.

As shown in FIG. 4, the top gate type thin film transistor 300 includes a gate insulating layer 330 disposed between the active layer 310 and the gate electrode layer 320, an interlayer insulating layer 340 insulating the gate electrode layer 320 from the source-drain electrode layer, and a passivation layer 350 covering the source-drain electrode layer. The source-drain electrode layer includes a source electrode 370 and a drain electrode 360.

In order to simplify the manufacturing process, the auxiliary connection member 110 and the active layer 310 of the thin film transistor 300 may be disposed in a same layer.

An initial auxiliary connection member may be formed simultaneously with forming the active layer 310. The auxiliary connection member 110 may then be obtained by conductorizing the initial auxiliary connection member. As shown in FIG. 4, the auxiliary connection member 110 is spaced apart from the auxiliary electrode 100 by the passivation layer 350 and the interlayer insulating layer 340, and thus the auxiliary electrode 100 is electrically coupled to the auxiliary connection member 110 through an auxiliary connection via hole 110a.

In order to increase the light transmittance of the transparent display region II, materials should be provided as less as possible in the transparent display region II. For example, organic film layers, such as a pixel defining layer 700, a planarization layer 800, should be provided with a through hole at the transparent display region II.

Materials of the organic film layers in the transparent display region II may be removed by exposure and development.

Since each of the passivation layer 350 and the interlayer insulating layer 340 is made of an inorganic material having high transparency and has a small thickness, the materials of the passivation layer 350 and the interlayer insulating layer 340 in the transparent display region II may not be removed (in other words, the passivation layer 350 extends throughout the light emitting region I and the transparent display region II, and the interlayer insulating layer 340 extends throughout the light emitting region I and the transparent display region II), so that the light transmittance of the transparent display region II is not reduced, and the structure of a mask plate for patterning the passivation layer 350 and the interlayer insulating layer 340 may be simplified. In this embodiment, an auxiliary connection via hole 230*a* penetrating through the passivation layer 350 and the interlayer insulating layer 340 may be provided within the transparent display region II, so that the second electrode layer is electrically coupled with the auxiliary connection member 110 through the auxiliary connection via hole 230*a*.

However, the present disclosure is not limited thereto. For example, the materials of the passivation layer 350 and the interlayer insulating layer 340 in the transparent display region II may be removed, so that the portion of the second electrode layer in the transparent display region II may be directly electrically coupled to the auxiliary connection member 110 when the second electrode layer is formed without the need to provide the auxiliary connection via hole.

In the present disclosure, a material for forming the active layer 310 is not particularly limited. For example, the active layer 310 may be formed using an IGZO (Indium Gallium Zinc Oxide) material, and accordingly, the auxiliary connection member 110 may be formed using a conductorized IGZO material.

It is easily understood that the display substrate includes the base substrate 400, the thin film transistor 300 is disposed on the base substrate 400, and the light emitting element 200 is disposed on a side of the thin film transistor 300 away from the base substrate 400. That is, the base substrate 400 and the thin film transistor 300 are both located on a side of the light emitting element 200 opposite to the light exiting side of the light emitting element 200. The thin film transistor 300 in the light emitting region I serves as a driving circuit that drives the light emitting element 200 to emit light.

In order to prevent external light from affecting the active layer 310, in some embodiments, the display substrate further includes a light shielding layer 500 on the base substrate 400, and a buffer layer 600 covering the light shielding layer 500 and a portion of the base substrate 400 on which the light shielding layer 400 is not disposed. The thin film transistor 300 is disposed on the buffer layer 600, and an orthographic projection of the active layer 310 of the thin film transistor 300 on the base substrate 400 is within an orthographic projection of the light shielding layer 500 on the base substrate 400.

In the present disclosure, a material of the light shielding layer 500 is not particularly limited. For example, the light shielding layer 500 may be made of a metal material. In order to avoid the light shielding layer 500 from generating static electricity to cause the "dual-gate" thin film transistor, in some embodiments, the drain electrode 360 of the thin film transistor 300 may be electrically coupled to the light shielding layer 500 through a buffer connection via hole 360*a* penetrating through the interlayer insulating layer 340 and the buffer layer 600.

In the present disclosure, a type of the light emitting element 200 is not particularly limited. For example, the light emitting element 200 may be a top emission type organic light emitting diode, the first electrode 210 is an anode of the light emitting element 200, and the second electrode 230 is a cathode of the light emitting element 200.

The anode may be made of a metal material and the cathode may be made of a transparent electrode material.

As another aspect of the present disclosure, there is provided a display panel including a display substrate, the display substrate being any one of the above-mentioned display substrates described herein.

As described above, the integrity of the light emitting element in the display substrate is not damaged, and the auxiliary connection member is transparent, so that when the display panel performs display, the light emitting elements all have a large aperture ratio. The auxiliary electrode is electrically coupled with the second electrode layer. Which is an entire plate electrode, to form a parallel structure, thereby reducing the IR drop during display and improving the uniformity of display brightness.

Figure 6:
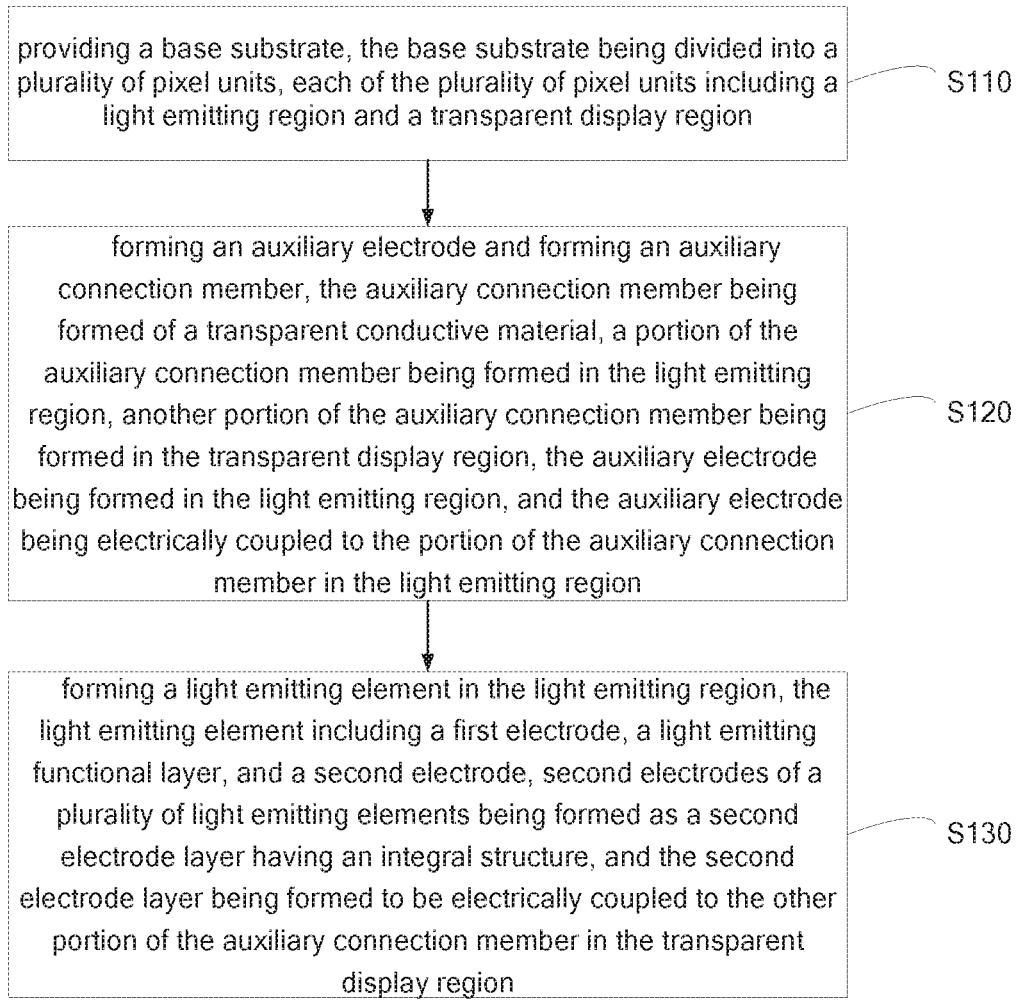
FIG. 6 is a flow chart of a method of manufacturing a display substrate according to some embodiments of the present disclosure.

As another aspect of the present disclosure, there is provided a method of manufacturing a display substrate. As shown in FIG. 6, in some embodiments, the method may include steps S110 to S130.

In step S110, a base substrate is provided, the base substrate being divided into a plurality of pixel units, each of the plurality of pixel units including a light emitting region and a transparent display region.

In step S120, an auxiliary electrode and a plurality of auxiliary connection members are formed, the auxiliary connection member being formed of a transparent conductive material, a portion of the auxiliary connection member being formed in the light emitting region, another portion of the auxiliary connection member being formed in the transparent display region, the auxiliary electrode being formed in the light emitting region, and the auxiliary electrode being formed to be electrically coupled to the portion of the auxiliary connection member in the light emitting region.

In step S130, a light emitting element including a first electrode, a light emitting functional layer, and a second electrode is formed in the light emitting region, second electrodes of a plurality of light emitting elements being formed as a second electrode layer having an integral structure, and the second electrode layer being formed to be electrically coupled to the portion of the auxiliary connection member in the transparent display region.

By using the method provided by the present disclosure, a display substrate with the auxiliary electrode and the auxiliary connection member both located on a side of the light emitting element close to the base substrate, i.e., the display substrate provided by the present disclosure, can be manufactured.

The working principle and the beneficial effects of the display substrate have been described in detail above, and will not be described in detail here.

In some embodiments, before step S130, the method further includes a step of forming a thin film transistor in the light emitting region. In an embodiment, this step may include steps of forming a pattern including an active layer; forming a gate insulating layer; forming a pattern including a gate electrode layer; forming an interlayer insulating layer;

forming a pattern including a source-drain electrode layer; and forming a passivation layer. The step of forming the auxiliary electrode and the step of forming the pattern including the gate electrode layer are performed simultaneously; or, the step of forming the auxiliary electrode and the step of forming the pattern including the source-drain electrode layer are performed simultaneously.

By performing the step of forming the auxiliary electrode and the step of forming the pattern including the gate electrode layer simultaneously or performing the step of forming the auxiliary electrode and the step of forming the pattern including the source-drain electrode layer simultaneously, a separate step of forming the auxiliary electrode is not required, so that the manufacturing process can be simplified.

In order to simplify the manufacturing process, the auxiliary connection member may be obtained by conductorizing a semiconductor material, and accordingly, the step of forming the auxiliary connection member may include a step of forming an initial auxiliary connection member, which is performed simultaneously with the step of forming the pattern including the active layer; and a step of conductorizing the initial auxiliary connection member to obtain the auxiliary connection member.

In some embodiments, the step of conductorizing the initial auxiliary connection to obtain the auxiliary connection member is performed after the step of forming the pattern including the gate electrode layer. In an embodiment, after the pattern including the gate electrode layer is formed, the semi-finished product of the entire display substrate may be subjected to a plasma treatment using the gate electrode layer as a blocking pattern. Since the gate electrode layer is used as the blocking pattern, the active layer under the gate electrode layer is not conductorized, and the initial auxiliary connection member not blocked by the gate electrode layer is conductorized.

In an embodiment, the step of forming the auxiliary electrode and the step of forming the pattern including the source-drain electrode layer are performed simultaneously. Moreover, the materials of the passivation layer and the interlayer insulating layer within the transparent display region may not be removed, i.e., both the passivation layer and the interlayer insulating layer are formed to extend throughout the light emitting region and the transparent display region. Correspondingly, before the step of forming the pattern including the source-drain electrode layer, the method further includes a step of: forming an auxiliary connection via hole penetrating through the passivation layer and the interlayer insulating layer. The second electrode layer is formed to be electrically coupled with the auxiliary connection member through the auxiliary connection via hole.

In an embodiment, the display substrate may further include a light shielding pattern, and accordingly, after the step of providing the base substrate and before the step of forming the thin film transistor, the method further includes steps of forming a layer of a light shielding pattern on the base substrate; and forming a buffer layer covering the layer of the light shielding pattern and a portion of the base substrate on which the layer of the light shielding pattern is not formed. An orthographic projection of the active layer of the thin film transistor on the base substrate is within in an orthographic projection of the layer of the light shielding pattern on the base substrate.

Next, by way of a non-limiting example, a brief description is given to how a display substrate including the pixel unit shown in FIGS. 3 and 4 is formed: providing a base substrate; sputtering and depositing a metal layer on the base substrate to serve as a light shielding layer, a material of which may be selected from conductive metal materials capable of shielding light, such as AlNd/Mo, and the thickness of the light shielding layer being about 2000 Å; then depositing a buffer layer by plasma enhanced chemical vapor deposition (PECVD), where a material of the buffer layer may be silicon oxide ($SiO_x$) or silicon nitride ($SiN_x$), and the thickness of the buffer layer is about 3000 Å; then sputtering and depositing an indium gallium zinc oxide (IGZO) thin film which is used as a material of an active layer in the light emitting region and an initial auxiliary connection member in the transparent display region, and the thickness of the IGZO thin film is about 400 Å; then depositing a gate insulating layer, where a material of the gate insulating layer may be silicon oxide, and the thickness of the gate insulating layer is about 1500 Å; sputtering and depositing gate metal, and completing a top gate structure by a self-alignment process, where the gate metal may be a metal material with good conductivity, such as Al, Cu or the like; performing a conductorization process on the initial auxiliary connection member in the transparent display region after the self-alignment process so as to obtain an auxiliary connection member; depositing an interlayer insulating layer, where an silicon oxide film may be used as the interlayer insulating layer, and the thickness of the interlayer insulating layer is about 4000 Å to about 6000 Å; forming a source electrode via hole, a drain electrode via hole and a buffer connection via hole which penetrate through the interlayer insulating layer; depositing a source-drain electrode layer and an auxiliary electrode; depositing a passivation layer; forming an auxiliary connection via hole at a position corresponding to the auxiliary connection member; forming a planarization layer to only cover the light emitting region; forming a first electrode; forming a pixel defining layer, where the pixel defining layer includes a pixel-opening corresponding to the light emitting region and a transparent-display-opening corresponding to the transparent display region; forming a light emitting functional layer; and forming a second electrode layer, the second electrode layer being electrically coupled with the auxiliary connection member through the auxiliary connection via hole.

It is to be understood that the above embodiments are merely exemplary embodiments employed to explain the principles of the present disclosure, and the present disclosure is not limited thereto. Various modifications and improvements may be made by those skilled in the art without departing from the spirit and essence of the present disclosure, and are intended to be within the scope of the disclosure.

What is claimed is:

1. A display substrate, comprising a plurality of pixel units, each of the plurality of pixel units comprising a light emitting region and a transparent display region, a light emitting element being provided in the light emitting region and comprising a first electrode, a light emitting functional layer and a second electrode, the second electrode being on a light exiting side of the light emitting element, and second electrodes of a plurality of light emitting elements forming a second electrode layer having an integral structure, wherein the display substrate further comprises an auxiliary electrode in the light emitting region, the auxiliary electrode being on a side of the light emitting element opposite to the light exiting side and made of a metal material, and wherein the display substrate further comprises an auxiliary connection member made of a transparent conductive material, a portion of the auxiliary connection member being in the light emitting region, another portion of the auxiliary connection member being in the transparent display region, the auxiliary electrode is electrically coupled with the portion of the auxiliary connection member in the light emitting region, and the second electrode layer is electrically coupled with the other portion of the auxiliary connection member in the transparent display region;

wherein a thin film transistor with a top gate type is in the light emitting region, the thin film transistor being on the side of the light emitting element opposite to the light exiting side and comprising a source-drain electrode layer and a gate electrode layer, and wherein the auxiliary electrode and the source-drain electrode layer are in a same layer;

wherein the display substrate further comprises:

a base substrate;

a light shielding laser on the base substrate;

a buffer layer covering the light shielding layer and a portion of the base substrate on which the light shielding layer is not provided, wherein the thin film transistor is on the buffer layer, and an orthographic projection of an active layer of the thin film transistor on the base substrate is within an orthographic projection of the light shielding layer on the base substrate;

an interlayer insulating layer having a single layer structure, not existing in the transparent display region, existing in the light emitting region, and covering the gate electrode layer to insulate the source-drain electrode layer from the gate electrode layer; and a passivation layer, not existing in the transparent display region, existing in the light emitting region, and covering the source-drain electrode layer, wherein the second electrode layer is in direct contact with the auxiliary connection member in the transparent display region; and wherein the source-drain electrode layer of the thin film transistor comprises a source electrode and a drain electrode, and the drain electrode is in direct contact with the light shielding layer through a via hole, the via hole penetrating through the interlayer insulating layer and the buffer layer.

2. The display substrate of claim 1, wherein the auxiliary connection member comprises a conductorized transparent semiconductor material.

3. The display substrate of claim 1, wherein the auxiliary connection member and an active layer of the thin film transistor are in a same layer, the active layer comprises a first semiconductor material, and the auxiliary connection member comprises a conductorized first semiconductor material.

4. The display substrate of claim 3, wherein the first semiconductor material comprises indium gallium zinc oxide.

5. The display substrate of claim 1, wherein the first electrode is an anode and the second electrode is a cathode.

6. A display panel, comprising a display substrate, wherein the display substrate is the display substrate of claim 1.

7. A method of manufacturing a display substrate, comprising steps of:

providing a base substrate, the base substrate being divided into a plurality of pixel units, each of the plurality of pixel units comprising a light emitting region and a transparent display region;

forming an auxiliary electrode and forming an auxiliary connection member, the auxiliary connection member being formed of a transparent conductive material, a portion of the auxiliary connection member being formed in the light emitting region, another portion of the auxiliary connection member being formed in the transparent display region, the auxiliary electrode being formed in the light emitting region, and the auxiliary electrode being formed to be electrically coupled to the portion of the auxiliary connection member in the light emitting region; and forming a light emitting element in the light emitting region, the light emitting element comprising a first electrode, a light emitting functional layer, and a second electrode, second electrodes of a plurality of light emitting elements being formed as a second electrode layer having an integral structure, and the second electrode layer being formed to be electrically coupled to the other portion of the auxiliary connection member in the transparent display region, wherein the method further comprises a step of forming a thin film transistor in the light emitting region before the step of forming a tight emitting element in the light emitting region, wherein the slop of forming a thin film transistor in the light emitting region comprises steps of:

forming a pattern comprising an active layer;

forming a gate insulating layer;

forming a pattern comprising a gate electrode layer;

forming an interlayer insulating layer having a single layer structure;

forming a pattern comprising a source-drain electrode layer; and forming a passivation layer, wherein the step of forming an auxiliary electrode and the step of forming a pattern comprising a source-drain electrode layer are performed simultaneously;

wherein the interlayer insulating layer and the passivation Saver are not formed in the transparent display region and are formed in the light emitting region;

wherein the second electrode layer is formed to be in direct contact with the auxiliary connection member in the transparent display region;

wherein after the step of providing a base substrate and before the step of forming a thin film transistor, the method further comprises steps of:

forming a layer of a light shielding pattern on the base substrate; and forming a buffer layer covering the layer of the light shielding pattern and a portion of the base substrate on which the layer of the light shielding pattern is not provided, wherein an orthographic projection of the active layer of the thin film transistor on the base substrate is within an orthographic projection of the layer of the light shielding pattern on the base substrate, and wherein the source-drain electrode layer is formed to include a source electrode and a drain electrode, and the drain electrode is in direct contact with the light shielding layer through a via hole, the via hole penetrating through the interlayer insulating layer and the buffer layer.

8. The method of claim 7, wherein the auxiliary connection member is formed by performing a conductorization process on a transparent semiconductor material to form a conductrized transparent semiconductor material.

9. The method of claim 7, wherein the step of forming an auxiliary connection member comprises steps of:
   forming an initial auxiliary connection member while the step of forming a pattern comprising an active layer is performed, a material of the active layer being the same as a material of the initial auxiliary connection member; and
   conductorizing the initial auxiliary connection member to obtain the auxiliary connection member.

10. The method of claim 9, wherein the material of the active layer comprises indium gallium zinc oxide.

11. The method of claim 9, wherein the step of conductorizing the initial auxiliary connection member to obtain the auxiliary connection member is performed after the step of forming a pattern comprising a gate electrode layer.

12. The method of claim 7, wherein the first electrode is an anode and the second electrode is a cathode.

\* \* \* \* \*